United States Patent [19]
Miyata et al.

[11] Patent Number: 5,686,753
[45] Date of Patent: Nov. 11, 1997

[54] SCHOTTKY BARRIER DIODE HAVING A MESA STRUCTURE

[75] Inventors: Tomoyasu Miyata, Shiga-ken; Koichi Sakamoto, Otsu; Katsutoshi Toyama, Urazoe; Masaaki Sueyoshi, Shiga-ken, all of Japan

[73] Assignee: Murata Manufacturing Co., Ltd., Japan

[21] Appl. No.: 777,570

[22] Filed: Dec. 31, 1996

Related U.S. Application Data

[63] Continuation of Ser. No. 555,393, Nov. 19, 1995, abandoned.

[30] Foreign Application Priority Data

Nov. 11, 1994 [JP] Japan .................... 6-278035

[51] Int. Cl.$^6$ .................... H01L 29/74; H01L 27/095; H01L 29/47
[52] U.S. Cl. .................... 257/471; 257/109; 257/472; 257/473
[58] Field of Search .................... 257/109, 471, 257/472, 473, 476, 477, 478, 487, 491

[56] References Cited

U.S. PATENT DOCUMENTS 5,041,881  8/1991  Bishop et al. .................... 257/109
5,365,102  11/1994  Mehrotra et al. .................... 257/475

FOREIGN PATENT DOCUMENTS 0506450  9/1992  European Pat. Off. .

OTHER PUBLICATIONS

Patent Abstracts Of Japan, vol. 4, No. 145 (E-029), 14 Oct. 1980 & JP-A-55 095374 (NEC CORP), 19 Jul. 1980, abstract.

Patent Abstracts Of Japan, vol. 4, No. 185 (E-038), 19 Dec. 1980 & JP-A-55 128879 (NEC CORP), 6 Oct. 1980, abstract.

European Search Report dated Jun. 14, 1996.

*Primary Examiner*—Carl Whitehead, Jr.

[57] ABSTRACT

In a Schottky barrier diode, concentration of an electrical field at an edge of an insulation layer is suppressed to improve the reverse breakdown voltage. An n– layer of a compound semiconductor substrate having an n+ layer and the n– layer is configured in the form of a mesa. An insulation layer is formed on at least a skirt portion and a slant portion of the mesa. An anode is formed on the insulation layer and n– layer, and a cathode is formed on the n+ layer. Thus, concentration of an electrical field at an edge of the insulation layer is canceled at least in part by an electrical field generated at the anode on the slant portion to improve the reverse breakdown voltage.

11 Claims, 2 Drawing Sheets

SCHOTTKY BARRIER DIODE HAVING A MESA STRUCTURE

This is a Continuation of Application Ser. No. 08/555,393 filed on Nov. 9, 1995, now abandoned.

BACKGROUND OF THE INVENTION

1. Field of the Invention

The present invention relates to a Schottky barrier diode wherein the reverse breakdown voltage is improved by forming the compound semiconductor substrate in the form of a mesa, so that a fringe component of an electrical field that concentrates at an edge of an insulation layer is cancelled by an electrical field of an anode formed at a slant portion of the mesa.

2. Description of the Background Art

As shown in FIG. 5, conventional Schottky diodes have a structure wherein a cathode 12 is formed on an n+ layer 11a of a GaAs substrate and an anode 13 is formed on an n- layer 11b of the GaAs substrate. However, when a reverse bias voltage is applied to a Schottky barrier diode having such a conventional structure, a fringe effect of an electrical field causes concentration of an electrical field at an edge 14 of the anode 13. As a result, breakdown can occur at a low reverse bias voltage. In order to suppress such concentration of an electrical field, according to an improvement in the prior art shown in FIG. 6, an insulation layer 15 such as a nitride film is interposed between the n- layer 11b and the anode 13 at a peripheral portion of the GaAs substrate, to improve the reverse breakdown voltage.

Although the conventional improved Schottky barrier diode shown in FIG. 6 has a reverse breakdown voltage that is somewhat better than that of the conventional Schottky barrier diode shown in FIG. 5, the reverse breakdown voltage is still insufficient because a fringe component of the concentrated electrical field still cannot be sufficiently suppressed at an edge 16 of the insulation layer 15.

It is therefore an object of the present invention to provide a Schottky barrier diode wherein concentration of an electrical field at an edge of the insulation layer is suppressed so as to improve the reverse breakdown voltage.

SUMMARY OF THE INVENTION

Embodiments of the present invention solve the above-described problem by providing a Schottky barrier diode including a compound semiconductor substrate constituted by an n+ layer and an n- layer which is configured in the form of a mesa, an insulation layer formed on at least a skirt portion and a slant portion of the mesa, an anode formed on the n- layer and the insulation layer, and a cathode formed on the n+ layer, in which concentration of an electrical field at an edge of the insulation layer is canceled by an electrical field generated by the anode at the slant portion, thereby improving the reverse breakdown voltage.

According to a feature of the present invention, an n- layer of a compound semiconductor substrate is configured in the form of a mesa; an insulation layer is formed on at least a skirt portion and a slant portion of the mesa; and an anode is formed on the insulation layer and the n- layer. As a result, an electrical field that concentrates at an edge of the insulation layer is canceled by an electrical field generated by the anode on the slant portion, so as to improve the reverse breakdown voltage.

Other features and advantages of the present invention will become apparent from the following description of embodiments of the invention which refers to the accompanying drawings.

DETAILED DESCRIPTION OF EMBODIMENTS OF THE INVENTION

Preferred embodiments of the present invention will now be described with reference to the accompanying drawings.

Figure 1:
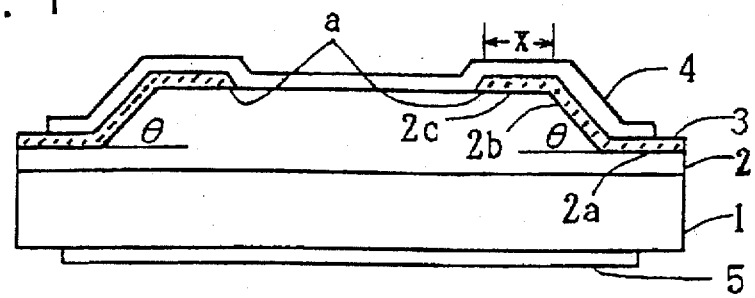
FIG. 1 shows a configuration of a first embodiment of the present invention.

FIG. 1 shows a first embodiment of the present invention. In FIG. 1, reference numeral 1 designates an n+ layer of a GaAs substrate, and reference numeral 2 designates an n- layer of the GaAs substrate. The n- layer 2 of the GaAs substrate is configured in the form of a mesa so as to have a top portion, a side face referred to as a slant portion 2b, and a lower portion referred to as a skirt portion 2a. An insulation layer 3 such as a nitride film is formed on the skirt portion 2a, the slant portion 2b, and a top peripheral portion 2c of the mesa. The slant portion 2b is formed to have an inclination θ in the range of about 10 to 90 deg. An anode 4 is formed on the central portion of the top of the n- layer 2 (radially within the top peripheral portion 2c) and on the insulation layer 3. Further, a cathode 5 is formed on the underside of the n+ layer 1 of the GaAs substrate.

A method of manufacturing a device having the above configuration will now be described. Wet etching is performed to form the n- layer 2 of the GaAs substrate in the form of a mesa. Thereafter, an insulation layer 3 such as a nitride film is formed on the mesa-shaped n- layer 2 of the GaAs substrate, and the insulation layer 3 is removed at the center of the n- layer 2 of the GaAs substrate by means of wet etching to provide an opening. Then, the anode 4 and cathode 5 are formed using vapor deposition.

Figure 2:
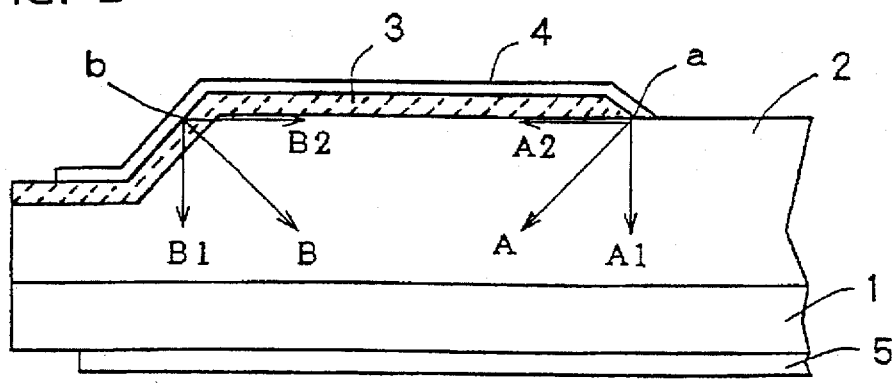
FIG. 2 is an enlargement of a portion of FIG. 1, showing a mechanism for suppressing concentration of an electrical field.

A description will now be made with reference to FIG. 2 of a mechanism for suppressing a fringe component of an electrical field that concentrates at an edge a of the insulation layer 3 in the present embodiment. When a reverse bias voltage is applied, the direction of the electrical field at the edge a of the insulation layer 3 becomes perpendicular to the anode 4 as indicated by a vector A. The electrical field indicated by the vector A is divided into a vertical component A1 and a horizontal component A2. The horizontal component A2 is a fringe component of the electrical field that concentrates at the edge a. On the other hand, the direction of an electrical field at a slant point b of the anode 4 is perpendicular to the anode 4 as indicated by a vector B. The electrical field indicated by the vector B is divided into a vertical component B1 and a horizontal component B2. Thus, the directions of the horizontal component (fringe component) A2 of the electrical field at the edge a and the horizontal component B2 of the electrical field at the slant point b are opposite to each other. Therefore, the horizontal component (fringe component) A2 of the electrical field at the edge a is canceled and suppressed by the electrical field generated at the slant point b of the mesa. This improves the reverse breakdown voltage at the edge a.

A second embodiment of the present invention will now be described with reference to FIG. 3. The shape of the mesa in the present embodiment is substantially the same as that in the first embodiment shown in FIG. 1. Therefore, parts identical to those in the first embodiment are indicated by the same reference numerals as in the first embodiment. The present embodiment is different from the first embodiment primarily in the shape of an insulation layer 3a. The insulation layer 3a may be formed by changing the etching time of the insulation layer as described with reference to the first embodiment. In particular, the insulation layer 3a covers the slant portion 2b perfectly, so that the top of the mesa and the edge of the insulation layer 3a form a flat surface. Such a flat structure may be formed by removing the insulation layer on the top of the mesa by means of RIE (reactive ion etching) using a resist pattern such as spin on glass (SOG). In the present embodiment, the insulation layer 3a is formed on the slant portion 2b and skirt portion 2a of the mesa, and an anode 4a is formed on the top of the mesa and the insulation layer 3a.

According to the second embodiment, concentration of an electrical field occurs at an edge a of the insulation layer 3 as in the first embodiment. An electrical field generated by the anode 4a formed on the insulation layer 3a on the slant portion 2b of the mesa acts on the electrical field that concentrates at the edge a to suppress a fringe component in the concentrated electrical field like the mechanism illustrated in FIG. 2. Thus, the reverse breakdown voltage is improved.

A third embodiment of the present invention will now be described with reference to FIG. 4. The shape of the mesa in the present embodiment is substantially the same as that in the first embodiment shown in FIG. 1. Therefore, parts identical to those in the first embodiment are indicated by the same reference numerals as in the first embodiment. This third embodiment is different from the first embodiment primarily in the shape of an insulation layer 3b. The insulation layer 3b is formed by changing the etching time of the insulation layer as described with reference to the first embodiment. In the present embodiment, the insulation layer 3b is formed on a lower part of the slant portion 2b and on the skirt portion 2a of the mesa, and an anode 4b is formed on the top of the mesa, an upper part of the slant portion 2b, and the insulation layer 3b.

According to the third embodiment, concentration of an electrical field occurs at an edge a of the insulation layer 3 as in the first embodiment. An electrical field generated by the anode 4b formed directly on the upper part of the n– layer 2 of the GaAs substrate at the slant portion 2b of the mesa acts on the electrical field that concentrates at the edge a to suppress a fringe component in the concentrated electrical field like the mechanism illustrated in FIG. 2. Thus, the reverse breakdown voltage is improved.

A more specific embodiment will now be described. A GaAs substrate has been chosen to satisfy the conditions as shown below, and a reverse breakdown voltage has been measured as shown below for each of the configurations of the insulation layer and anode as illustrated in the drawings of the preferred embodiments and the prior art. The measurement obtained with the conventional configuration is shown for reference. The reverse breakdown voltages are values obtained at a leakage current of 0.5 mA.

Figure 3:
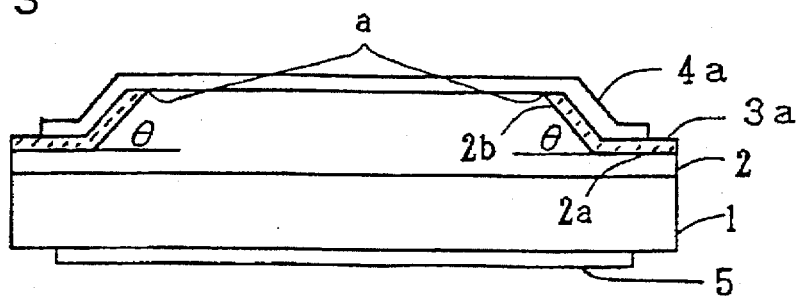
FIG. 3 shows a configuration of a second embodiment of the present invention.
Figure 4:
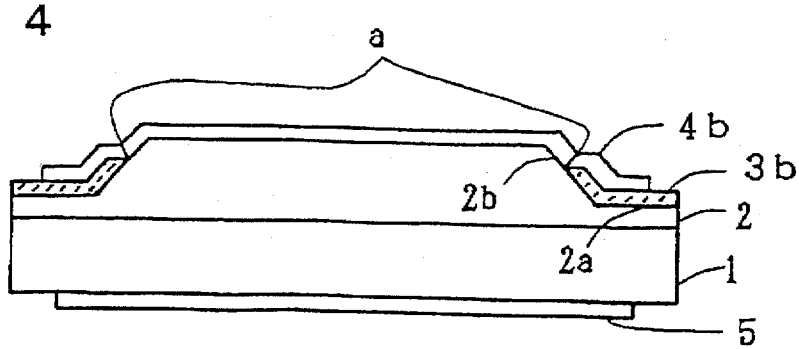
FIG. 4 shows a configuration of a third embodiment of the present invention.
Figure 5:
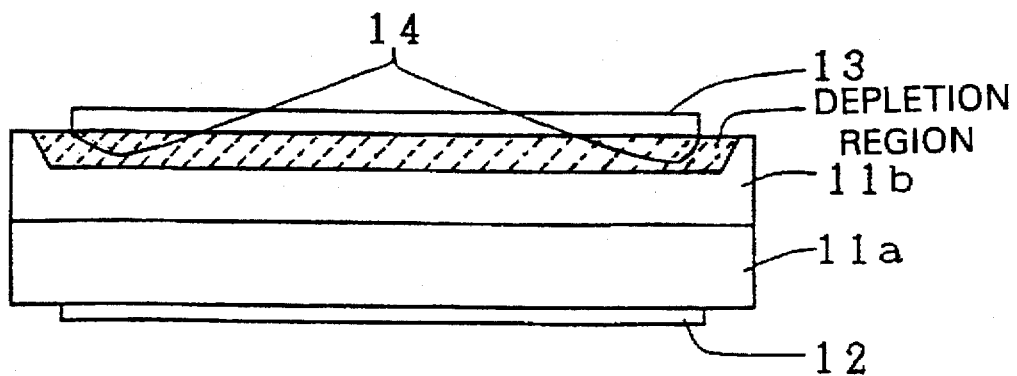
FIG. 5 shows a conventional configuration.
Figure 6:
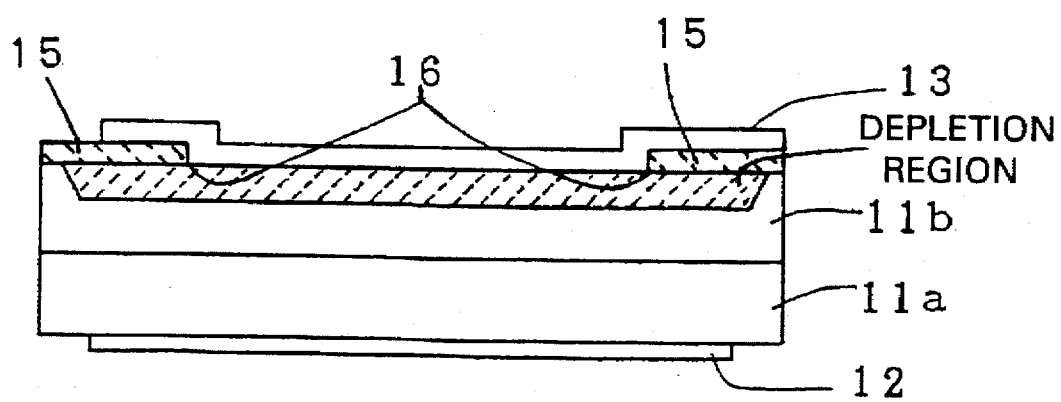
FIG. 6 shows another conventional configuration.

| [Conditions for the GaAs Substrate] | |
|---|---|
| Area of Anode | $0.4 \times 0.4$ mm$^2$ |
| Depth of Mesa (Height of Substrate at the Slant Portion) | 0.3–1.5 µm |
| Thickness of GaAs Substrate | 200 µm |
| Thickness of n– layer | 9.7 µm |
| Carrier Density of n– layer | $2.26 \times 10^{15}$ cm$^{-3}$ |
| [Measured Reverse Breakdown Voltage] | |
| Conventional Configuration shown in Fig. 6 | 88.2 V |
| First Embodiment Shown in FIG. 1 | 95.7 V |
| Second Embodiment Shown in FIG. 3 | 101.0 V |
| Third Embodiment Shown in FIG. 4 | 106.4 V |

The first embodiment shown in FIG. 1 provides a significant effect when the width of the intersection X is 3 µm or less. In other words, it is preferable for the insulation layer 2c to cover a portion of the top face of the mesa which is located within 3 µm or less from the edge of the top face.

According to the above embodiments of the present invention, an n– layer of a compound semiconductor substrate is configured in the form of a mesa; an insulation layer is formed on at least a skirt portion and a slant portion of the mesa; and an anode is formed on the insulation layer and n– layer. As a result, an electrical field that concentrates at an edge of the insulation layer is canceled by an electrical field generated at the anode on the slant portion to improve the reverse breakdown voltage.

The improved reverse breakdown voltage results in improved reliability. If a reverse breakdown voltage at a level available in the prior art is required, characteristics in the forward direction can be improved by increasing the carrier density of the n– layer or by reducing the thickness of the n– layer.

The above-described effects make it possible to reduce the area of the anode, which leads to a reduction in the size of the chip. Such a reduction in chip size allows the number of chips obtained from one sheet of wafer to be increased, and this results in a cost reduction.

While specific illustrated embodiments have been shown and described, it will be appreciated by those skilled in the art that various modifications, changes and additions can be made to the invention without departing from the spirit and scope thereof as set forth in the following claims.

What is claimed is:

1. A Schottky barrier diode comprising:
    a compound semiconductor substrate having an n+ layer and an n– layer, the n–layer being provided on the n+ layer and the n– layer being configured in the form of a mesa which has a skirt portion and a slant portion, said mesa being formed only by said n– layer;
    an insulation layer formed on at least the skirt portion and the slant portion of the mesa;
    an anode formed only on the insulation layer and the n– layer; and
    a cathode formed on the n+ layer.

2. A Schottky barrier diode as claimed in claim 1, wherein an electrical field that concentrates at an edge of the insulation layer is canceled at least in part by an electrical field generated at the anode on the slant portion to improve the reverse breakdown voltage of the Schottky barrier diode.

3. A semiconductor device comprising:
    a semiconductor substrate having an active layer which is configured in the form of a mesa which has a skirt portion and a slant portion, said mesa being formed only by said active layer;

an insulation layer formed on at least the skirt portion and the slant portion of the mesa;

an anode formed only on the insulation layer and the active layer; and a cathode formed on the substrate opposite the anode.

4. A semiconductor device as claimed in claim 3, wherein said semiconductor device is a Schottky barrier diode, said active layer being an n− layer, said substrate being a compound substrate having said n− layer and an n+ layer, and said cathode being formed on said n+ layer.

5. A semiconductor device as claimed in claim 4, wherein an electrical field that concentrates at an edge of the insulation layer is canceled at least in part by an electrical field generated at the anode on the slant portion to improve the reverse breakdown voltage of the semiconductor device.

6. A semiconductor device as claimed in claim 4, wherein said skirt portion of said n− layer is generally horizontal, said slant portion defines an angle with said skirt portion, and extends upward to a top surface of said mesa.

7. A semiconductor device as claimed in claim 6, wherein said angle is about 10–90 degrees.

8. A semiconductor device as claimed in claim 6, wherein said insulation layer covers the entire slant portion of the mesa.

9. A semiconductor device as claimed in claim 8, wherein said insulation layer further extends onto a portion of said top surface of said mesa.

10. A semiconductor device as claimed in claim 9, wherein said insulation layer extends about 3 μm or less onto said top surface of said mesa.

11. A semiconductor device as claimed in claim 6, wherein said insulation layer covers only part of said slant portion of the mesa.

* * * * *